(12) United States Patent
Ikeda et al.

(10) Patent No.: US 11,705,308 B2
(45) Date of Patent: Jul. 18, 2023

(54) PLASMA PROCESSING APPARATUS

(71) Applicant: Tokyo Electron Limited, Tokyo (JP)

(72) Inventors: Shintaro Ikeda, Miyagi (JP); Hidetoshi Hanaoka, Miyagi (JP); Naoki Tamaru, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 17/086,622

(22) Filed: Nov. 2, 2020

(65) Prior Publication Data

US 2021/0142983 A1  May 13, 2021

(30) Foreign Application Priority Data

Nov. 12, 2019  (JP) ................................ 2019-204977

(51) Int. Cl.
*H01J 37/32* (2006.01)
*H01J 37/16* (2006.01)

(52) U.S. Cl.
CPC .......... *H01J 37/3244* (2013.01); *H01J 37/16* (2013.01); *H01J 37/32183* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,583,858 A | * | 12/1996 | Hanaoka | H04L 49/20 370/395.42 |
| 6,716,303 B1 | * | 4/2004 | Ni | C23F 4/00 156/345.48 |
| 8,603,293 B2 | * | 12/2013 | Koshiishi | H01J 37/32018 156/345.43 |
| 9,490,105 B2 | * | 11/2016 | Koshiishi | H01J 37/32018 |
| 9,966,233 B2 | * | 5/2018 | Hanaoka | H01J 37/32651 |
| 10,546,727 B2 | * | 1/2020 | Koshiishi | H01J 37/32091 |
| 10,580,622 B2 | * | 3/2020 | Hanaoka | H01J 37/32091 |
| 2003/0178144 A1 | * | 9/2003 | Ohmi | H01J 37/32357 118/723 MW |
| 2006/0037703 A1 | * | 2/2006 | Koshiishi | H01J 37/32174 156/345.47 |
| 2006/0066247 A1 | * | 3/2006 | Koshiishi | H01J 37/32834 315/111.21 |
| 2007/0227664 A1 | * | 10/2007 | Matsumoto | H01J 37/32091 156/345.47 |
| 2007/0227666 A1 | * | 10/2007 | Matsumoto | H01L 21/31116 257/E21.252 |
| 2007/0235426 A1 | * | 10/2007 | Matsumoto | H01J 37/32082 219/121.43 |

(Continued)

FOREIGN PATENT DOCUMENTS

| | | | |
|---|---|---|---|
| JP | 2000-252261 | 9/2000 | |
| JP | 2008-251633 | 10/2008 | |
| WO | WO-2015174271 A1 | * 11/2015 | ........ H01J 37/32091 |

*Primary Examiner* — Srinivas Sathiraju
(74) *Attorney, Agent, or Firm* — IPUSA, PLLC

(57) ABSTRACT

There is provision of a plasma processing apparatus including a processing vessel, a first member provided in the processing vessel, and a second member provided outside the first member. In at least one of the first member and the second member, a gas flow passage is formed, and the gas flow passage is configured to cause a gas to flow into a gap between the first member and the second member.

15 Claims, 4 Drawing Sheets

(56) References Cited

U.S. PATENT DOCUMENTS

| | | | |
|---|---|---|---|
| 2011/0048453 A1* | 3/2011 | Honda | C23C 16/4405 134/1.1 |
| 2011/0114113 A1* | 5/2011 | Honda | B08B 7/0035 134/1.1 |
| 2011/0220492 A1* | 9/2011 | Hanaoka | H01L 21/32105 204/192.37 |
| 2011/0272097 A1* | 11/2011 | Koshiishi | H01J 37/32091 156/345.24 |
| 2012/0160418 A1* | 6/2012 | Hanaoka | H01J 37/32623 156/345.38 |
| 2014/0124139 A1* | 5/2014 | Koshiishi | H01J 37/32834 156/345.28 |
| 2015/0013907 A1* | 1/2015 | Fujii | H01J 37/3222 315/111.21 |
| 2015/0027635 A1* | 1/2015 | Hanaoka | H01J 37/32027 118/723 E |
| 2015/0114930 A1* | 4/2015 | Nonaka | H01J 37/32477 204/192.15 |
| 2016/0010209 A1* | 1/2016 | Hattori | C23C 16/45519 118/715 |
| 2016/0379805 A1* | 12/2016 | Koshiishi | H01J 37/32018 156/345.29 |
| 2017/0069470 A1* | 3/2017 | Murakami | H01J 37/32541 |
| 2018/0047543 A1* | 2/2018 | Setton | H01J 37/321 |
| 2018/0294147 A1* | 10/2018 | Hanaoka | H01J 37/32091 |
| 2019/0027344 A1* | 1/2019 | Okunishi | H01L 21/6833 |
| 2019/0027345 A1* | 1/2019 | Ishikawa | H01L 21/6833 |
| 2019/0362939 A1* | 11/2019 | Yamagishi | C23C 16/509 |
| 2020/0176226 A1* | 6/2020 | Tsukahara | H01J 37/32174 |
| 2020/0312634 A1* | 10/2020 | Ohta | H01J 37/32642 |
| 2021/0074520 A1* | 3/2021 | Shihommatsu | H01J 37/32082 |
| 2021/0118647 A1* | 4/2021 | Sasaki | H01J 37/32642 |
| 2021/0142983 A1* | 5/2021 | Ikeda | H01J 37/16 |

\* cited by examiner

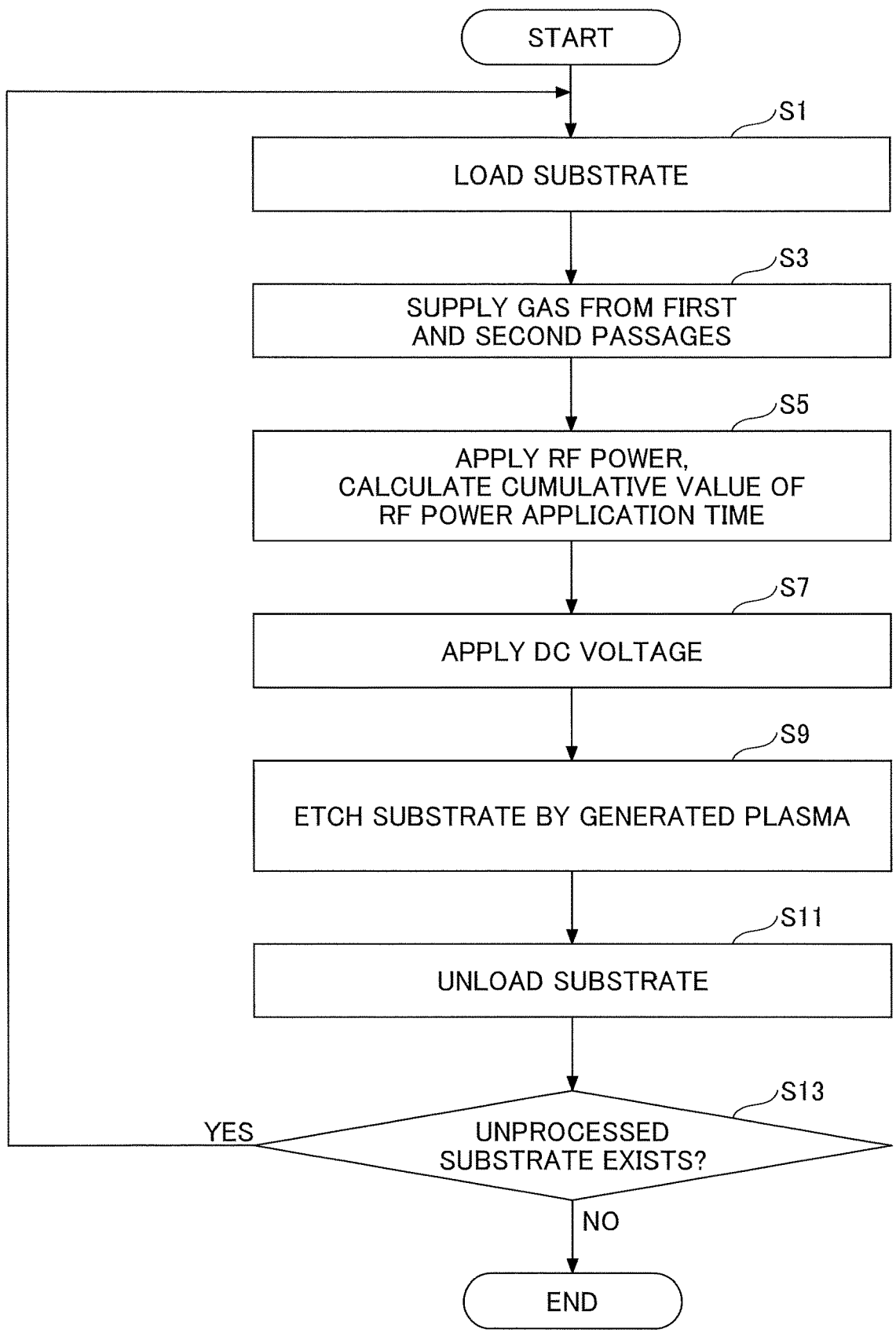

PLASMA PROCESSING APPARATUS

CROSS-REFERENCE TO RELATED APPLICATIONS

This patent application is based upon and claims priority to Japanese Patent Application No. 2019-204977 filed on Nov. 12, 2019, the entire contents of which are incorporated herein by reference.

TECHNICAL FIELD

The present disclosure relates to a plasma processing apparatus.

BACKGROUND

For example, Patent Document 1 describes a technique for removing reaction products deposited in a gap exposed to a plasma processing space in a plasma processing apparatus, by using ion bombardment.

RELATED ART DOCUMENT

Patent Document

[Patent Document 1] Japanese Laid-open Patent Application Publication No. 2008-251633

SUMMARY

The present disclosure provides a technique for suppressing adhesion of reaction products to gaps between members provided in a plasma processing apparatus.

According to one aspect of the present disclosure, there is provision of a plasma processing apparatus including a processing vessel, a first member provided in the processing vessel, and a second member provided outside the first member. In at least one of the first member and the second member, a gas flow passage is formed, and the gas flow passage is configured to cause a gas to flow into a gap between the first member and the second member.

BRIEF DESCRIPTION OF THE DRAWINGS

FIG. 4 is a flowchart illustrating an example of a plasma processing method according to the embodiment.

DETAILED DESCRIPTION OF EMBODIMENTS

Figure 1:
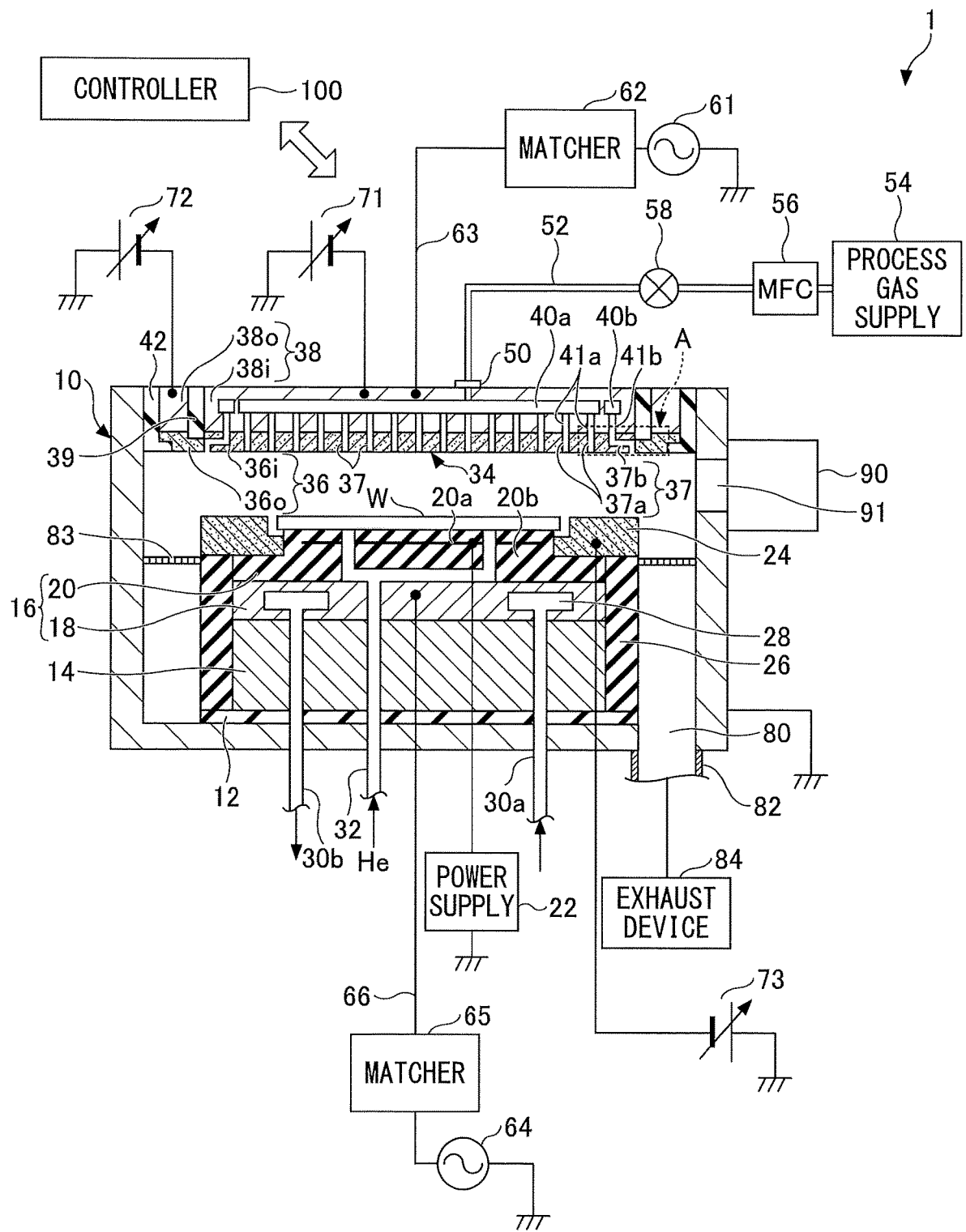
FIG. 1 is a cross-sectional diagram illustrating an example of a plasma processing apparatus according to an embodiment.

Hereinafter, embodiments for carrying out the present disclosure will be described with reference to the drawings. Note that in the drawings, elements having substantially identical features are given to the same reference symbols, and redundant descriptions will be omitted.

<Plasma Processing Apparatus>

A plasma processing apparatus 1 according to an embodiment will be described with reference to FIG. 1. FIG. 1 is a cross-sectional diagram illustrating an example of the plasma processing apparatus 1 according to the present embodiment. The plasma processing apparatus 1 according to the present embodiment is a capacitively coupled parallel plate processing apparatus, and includes a processing vessel 10. The processing vessel 10 is a cylindrical container formed of, for example, aluminum having a surface treated by anodic oxidation, and is grounded.

A cylindrical support platform 14 is disposed at the bottom of the processing vessel 10 via an insulating plate 12 made of ceramic or the like, and a stage 16 is provided on the support platform 14. The stage 16 includes an electrostatic chuck 20 and a base 18. A substrate W is placed on the upper surface of the electrostatic chuck 20. An annular edge ring 24 made of silicon for example is disposed around the substrate W. The edge ring 24 may also be referred to as a focus ring. The base 18 and the support platform 14 are surrounded by an annular insulator ring 26 made of quartz or the like. Inside the electrostatic chuck 20, a first electrode 20a made of a conductive film is provided at a position below the substrate W, in a state in which the first electrode 20a is embedded in an insulating layer 20b. The first electrode 20a is connected to a power supply 22, and generates electrostatic force by direct-current (DC) voltage applied from the power supply 22 to the first electrode 20a to attract the substrate W to the mounting surface of the electrostatic chuck 20. The electrostatic chuck 20 may include a heater to control the temperature.

Inside the base 18, for example, a ring-shaped or vortex-shaped flow passage 28 is formed. A medium at a predetermined temperature, such as refrigerant, is supplied from the chiller unit (not illustrated) to the flow passage 28 through a pipe 30a, and is returned to the chiller unit through a pipe 30b. As a result, heat extraction or the like occurs at the base 18, and the temperature of the substrate W can be controlled. Additionally, a heat transfer gas, such as He gas, is supplied from a heat transfer gas supply mechanism to a gap between the surface of the electrostatic chuck 20 and the back surface of the substrate W, via a gas supply line 32. This heat transfer gas improves heat transfer between the surface of the electrostatic chuck 20 and the back surface of the substrate W, and effectively controls the temperature of the substrate W. If the electrostatic chuck 20 has a heater, the temperature of the substrate W can be controlled responsively by the heater and the medium that passes through the flow passage 28.

The upper electrode 34 is provided at the ceiling of the processing vessel 10 so as to face the stage 16. A space between the upper electrode 34 and the stage 16 is a plasma processing space. The upper electrode 34 occludes the opening of the ceiling of the processing vessel 10 via an insulating shielding member 42. The upper electrode 34 includes an electrode plate 36 and an electrode support 38. The electrode plate 36 has an inner electrode plate 36i and an outer electrode plate 36o.

The inner electrode plate 36i is formed of a silicon-containing material such as silicon (Si) or silicon carbide (SiC), and a large number of gas flow passages (gas holes) 37 are formed in the inner electrode plate 36i. The openings of the gas flow passages (gas holes) 37 are formed on the lower surface of the inner electrode plate 36i facing the stage 16. The gas flow passages 37 include first gas flow passages 37a that penetrate the inner electrode plate 36i in a thickness direction of the inner electrode plate 36i, and second gas flow passages 37b whose cross-sections are formed in an L-shape. The openings of the second gas flow passages 37b at the lower surface of the inner electrode plate 36i are provided near the outer periphery of the inner electrode plate 36i, and the openings of the second gas flow passages 37b at the upper surface of the inner electrode plate 36i are located closer to the center of the inner electrode plate 36i relative to the openings of the second gas flow passages 37b at the lower surface of the inner electrode plate 36i.

The outer electrode plate 36o is formed of a silicon-containing material such as silicon or silicon carbide, and is disposed outside the inner electrode plate 36i. The inner electrode plate 36i is an example of a first member provided in the processing vessel 10. The outer electrode plate 36o is an example of a second member disposed outside the first member.

An Inner electrode support 38i removably supports the inner electrode plate 36i, and is formed of an electrically conductive member, such as an aluminum member having an anodized surface. Inside the inner electrode support 38i, a number of gas flow holes 41a and a number of gas flow holes 41b extend downward from gas diffusion chambers 40a and 40b respectively, and communicate with the gas flow passages 37. An outer electrode support 38o removably supports the outer electrode plate 36o, and is formed of an electrically conductive member, such as an aluminum member having an anodized surface. An insulating shielding member 39 is disposed between the inner electrode support 38i and the outer electrode support 38o.

A gas inlet 50 is connected to a process gas supply 54 via a gas supply line 52. In the gas supply line 52, a mass flow controller (MFC) 56 and an open/close valve 58 are provided in sequence from the upstream side where the process gas supply 54 is disposed. A process gas is supplied from the process gas supply 54, and flow of the process gas is controlled by the mass flow controller 56 and the open/close valve 58. The process gas is discharged from the gas flow passages 37 into the plasma processing space, through the gas supply line 52, the gas diffusion chambers 40a and 40b, and the gas flow holes 41a and 41b. Although not illustrated, the plasma processing apparatus 1 is configured such that a flow rate (conductance) of a gas discharged from the gas flow passages 37 through the gas flow holes 41a can be controlled independently of a flow rate of a gas discharged from the gas flow passages 37 through the gas flow holes 41b. With such a configuration, the upper electrode 34 also functions as a showerhead for supplying gas.

The plasma processing apparatus 1 includes a first radio frequency power supply 61 and a second radio frequency power supply 64. The first radio frequency power supply 61 is a power source that generates first radio frequency power. The frequency of the first radio frequency power is a frequency suitable for plasma generation, and may be, for example, within a range between 27 MHz and 100 MHz. The first radio frequency power supply 61 is connected to the upper electrode 34 via a matcher 62 and a power supply line 63. The matcher 62 includes circuitry for causing output impedance of the first radio frequency power supply 61 to match impedance of the load side (upper electrode 34 side). The first radio frequency power supply 61 may be connected, via matcher 62, to the stage 16 that functions as a lower electrode.

The second radio frequency power supply 64 is a power source that generates second radio frequency power. The frequency of the second radio frequency power is lower than the frequency of the first radio frequency power, and when the second radio frequency power is used in conjunction with the first radio frequency power, the second radio frequency power is used as radio frequency power for biasing in order to draw ions into the substrate W. The frequency of the second radio frequency power may be, for example, within a range between 400 kHz and 13.56 MHz. The second radio frequency power supply 64 is connected to the stage 16 via a matcher 65 and a power supply line 66. The matcher 65 includes circuitry for causing output, impedance of the second radio frequency power supply 64 to match impedance of the load side (base 18 side). In the present embodiment, radio frequency power may be referred to as "RF power". Also, the first radio frequency power may be referred to as "HF power", and the second radio frequency power may be referred to as "LF power".

It should be noted that a plasma may be generated using the second radio frequency power without using the first radio frequency power. That is, a plasma may be generated by only using a single type of RF power. In this case, the frequency of the second radio frequency power may be greater than 13.56 MHz, for example 40 MHz, and the plasma processing apparatus 1 is not required to have the first radio frequency power supply 61 and the matcher 62.

A first variable power supply 71 is connected to the inner electrode support 38i to apply DC voltage to the inner electrode plate 36i. A second variable power supply 72 is connected to the outer electrode support 38o to apply DC voltage to the outer electrode plate 36o. Thus, the plasma processing apparatus 1 is configured to apply DC voltage independently to the inner electrode plate 36i and the outer electrode plate 36o. A third variable power supply 73 is connected to the edge ring 24 to apply DC voltage to the edge ring 24. Note that DC voltage may be applied to the inner electrode plate 36i and the outer electrode plate 36o from, for example, at least one of the first variable power supply 71 and the second variable power supply 72.

An exhaust device 84 is connected to an exhaust pipe 82. The exhaust device 84 has a vacuum pump such as a turbomolecular pump, which evacuates the interior of the processing vessel 10 through the exhaust pipe 82 from an exhaust port 80 formed at the bottom of the processing vessel 10 to reduce the pressure in the processing vessel 10 to a desired degree of vacuum. Also, the exhaust device 84 controls the pressure in the processing vessel 10 to a constant pressure by using a value of a pressure gauge (not illustrated) that measures the pressure in the processing vessel 10.

An annular baffle plate 83 is provided between the insulator ring 26 and the inner side wall of the processing vessel 10. The baffle plate 83 has multiple through-holes. The baffle plate 83 is formed of aluminum, and the surface of the baffle plate 83 is coated with ceramic such as $Y_2O_3$.

A loading/unloading port 91 is provided at the side wall of the processing vessel 10 for loading and unloading a substrate W. Also, a gate valve 90 is provided for opening and closing the loading/unloading port 91.

The plasma processing apparatus 1 is provided with a controller 100 that controls operations of an entirety of the plasma processing apparatus 1. A central processing unit (CPU) provided in the controller 100 performs desired plasma processing, such as etching, in accordance with a recipe stored in a memory such as a ROM or a RAM. The recipe may include control information of the plasma processing apparatus 1 with respect to a process condition, such as processing time, pressure (gas exhaust), first, and second radio frequency power or voltage, and various gas flow rates. The recipe may also include information about temperatures in the processing vessel (e.g., upper electrode temperature, sidewall temperature of the processing vessel, temperature of a substrate W, and electrostatic chuck temperature), a temperature of the refrigerant output from the chiller unit, and the like. A program and the recipe representing these process conditions may be stored in a hard disk drive or a semiconductor memory. The recipe may also be stored in a removable computer-readable storage medium such as a CD-ROM, a DVD, or the like, and by the removable computer-readable storage medium being loaded in a predetermined location, the recipe may be read from the removable computer-readable storage medium.

When a predetermined plasma process, such as a plasma etching process, is performed in the plasma processing apparatus 1 of such a configuration, the gate valve 90 is opened, and a substrate W is loaded into the processing vessel 10 via the loading/unloading port 91. When the substrate W is placed on the stage 16, the gate valve 90 is closed. A process gas is supplied to the interior of the processing vessel 10, and the interior of the processing vessel 10 is evacuated by the exhaust device 84.

The first radio frequency power is applied to the upper electrode 34 and the second radio frequency power is applied to the stage 16. Also, DC voltage is applied from the power supply 22 to the first electrode 20a to attract the substrate W to the stage 16. Note that DC voltage may be applied from the first variable power supply 71 and the second variable power supply 72 to the inner electrode plate 36i and the outer electrode plate 36o respectively. Further, DC voltage may also be applied to the edge ring 24 from the third variable power supply 73. Plasma treatment, such as etching, is applied to the substrate W by radicals and/or ions in a plasma generated in the plasma processing space.

When plasma treatment is applied to the substrate W, reaction products (hereinafter referred to as "deposits") adhere to the inner side wall of the processing vessel 10 and gaps in the processing vessel 10. Thus, a dry cleaning process may be performed to remove the deposits deposited in the processing vessel 10 by plasma treatment. However, deposits adhere to a gap between the inner electrode plate 36i and the outer electrode plate 36o, and it is difficult to remove the deposits sufficiently by cleaning.

Figure 2A:
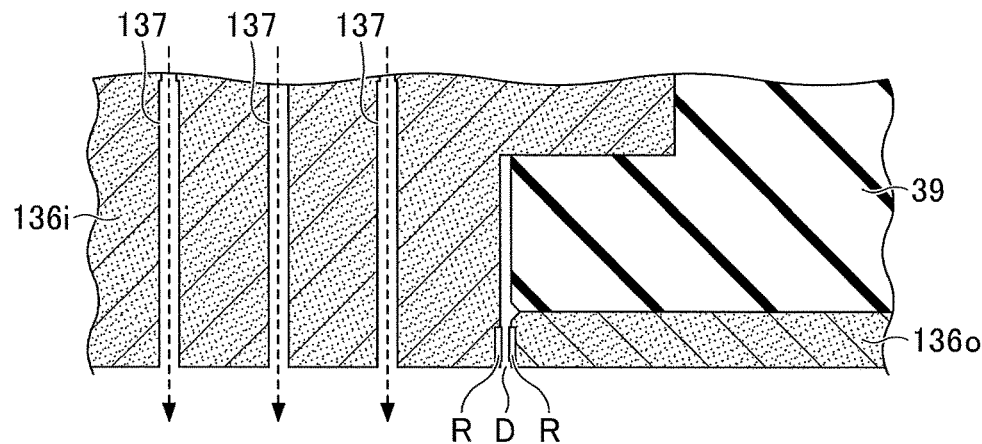
FIG. 2A illustrates an example of the peripheral structure of a conventional upper electrode.

FIG. 2A illustrates ar. example of the configuration of an inner electrode plate 136i and an outer electrode plate 136o of a conventional upper electrode, as a comparative example. In the comparative example, a number of vertical gas flow passages 137 are formed in the thickness direction of the inner electrode plate 136i. Also, deposits R containing carbon (C), fluorine (F), yttria (oxide of yttrium (Y)), yttrium fluoride, alumina (aluminum (Al) oxide), silicon (Si), and the like are adhering to a gap D between the inner electrode plate 136i and the outer electrode plate 136o.

When etching a substrate W, a process gas for generating a plasma is supplied from the gas flow passages 137. The process gas contains C and/or F. Also, the inner wall of the processing vessel 10 is coated with, for example, a thermal sprayed film of yttria. Mote that yttria is an example, and the thermal sprayed film may be made of alumina or other materials. In the following description, a case in which the inner wall of the processing vessel 10 is coated with a thermal sprayed film of yttria will be described.

The size of the gap D is approximately between 0.5 mm and 1 mm. Accordingly, solidified components of C and F produced when a plasma is formed from the process gas, and components of the thermal sprayed film of yttria, which has peeled off from the inner wall of the processing vessel 10 due to ion bombardment during plasma processing, enter the gap D of about 0.5 mm to 1 mm between the inner electrode plate 136i and the outer electrode plate 136o, and become deposits. As the deposits adhering to the gap D cannot be removed easily, the deposits are deposited in the gap D. When the deposits deposited in the gap D becomes more than a certain thickness, the deposits may peel off and fall onto the substrate W, as particles. The particles dropped on the substrate W affect etching of the substrate W. For example, the particles may cause a product defect and deterioration of an yield rate.

In addition, when deposits adhere to the gap D, the size of the gap D further becomes smaller, and abnormal discharge is likely to occur. Then, as the abnormal discharge further causes the deposits to peel off, more particles are generated. Although separate DC voltages can be applied to the inner electrode plate 136i and the outer electrode plate 136o, abnormal discharge may also cause abnormalities in the control of the DC voltages. If abnormal discharge occurs in the gap D, damage such as cracks may occur in the inner electrode plate 136i and the outer electrode plate 136o.

Accordingly, it is desirable to remove deposit adhering to the gap D between the inner electrode plate 136i and the outer electrode plate 136o. As a possible method of removing deposits, it may be considered to remove the deposits in the gap D by ion bombardment, by causing ions in a plasma to enter the gap D. In this method, incident angles of ions can be controlled by differentiating the thickness of a sheath formed on the lower surface of the inner electrode plate 136i from the thickness of a sheath formed on the lower surface of the outer electrode plate 136o, by controlling DC voltage applied to each of the inner electrode plate 136i and the outer electrode plate 136o independently. However, in such a controlling method, for example, from among the deposits R adhering to both sides of the gap D, even if deposits on one side on which ions are obliquely incident may be able to be removed as a result of controlling the thickness of the sheathes, ions are not incident on the other side. Thus, as deposits on the other side cannot be removed, effect of the ion bombardment cannot be sufficiently obtained. Also, in order to obtain the effect of ion bombardment, it is necessary to add a special step of causing ions to enter the gap D at an adequate angle, which results in poor throughput for the processing time of the step added. In addition, because the operation itself of causing ions to enter the gap D at an adequate angle is difficult, it is difficult to remove the deposits R in the gap D sufficiently.

[Peripheral Structure of Upper Electrode]

Accordingly, in the plasma processing apparatus 1 according to the present embodiment, a portion of the process gas supplied from the gas flow passages 37 is caused to flow into the gap D directly. By devising a supply path of the process gas necessary for processing the substrate W as described above, gas in the gap D, which contains C and F in the plasma, and components of the thermal sprayed film of yttria, which has peeled off from the inner wall of the processing vessel 10 due to ion bombardment, is replaced with the process gas. Accordingly, even if the process gas contains C and F, these components pass through the gap D in a state of gas, so that the solidified components of C and F do not adhere to the side wall of the gap D. Also, components of the thermal sprayed film of yttria, which has peeled off from the inner wall of the processing vessel 10 due to ion bombardment, do not enter the gap D. Accordingly, it is possible to avoid occurrence of a case in which solidified components of C and F, and components of the thermal sprayed film of yttria, which has peeled off from the inner wall of the processing vessel 10 due to ion bombardment, are deposited on the surface of the gap D as the deposits R. In addition, by adjusting conductance (flow rate)

of the process gas flowing into the gap D, the deposits R adhering to the gap D can be peeled off and removed.

Figure 2B:
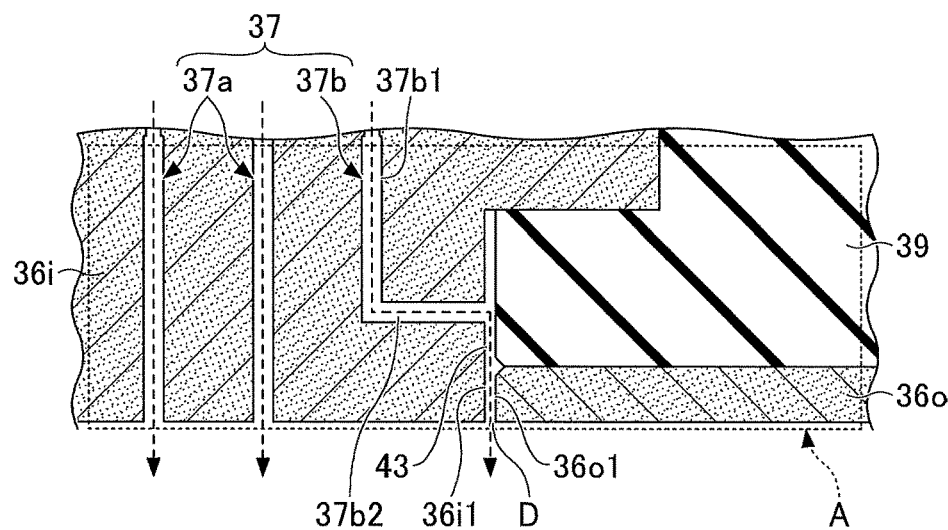
FIG. 2B illustrates an example of the peripheral structure of an upper electrode according to the embodiment.

The supply path of the process gas will be described in detail with reference to FIG. 2B. FIG. 2B is an enlarged view of the region A of FIG. 1, which illustrates an example of the supply path of the process gas in the upper electrode 34 according to the present embodiment.

The inner electrode plate 36$i$ and the outer electrode plate 36$o$ respectively have surfaces 36$i$1 and 36$o$1 facing each other across the gap D. The gas flow passages 37 are formed in the inner electrode plate 36$i$. The gas flow passages 37 formed in the inner electrode plate 36$i$ include the first gas flow passages 37$a$ and the second gas flow passages 37$b$.

The first gas flow passages 37$a$ penetrate the inner electrode plate 36$i$ in the thickness direction of the inner electrode plate 36$i$. Each of the second gas flow passages 37$b$ includes a gas flow passage 37$b$1 directed toward the thickness direction of the inner electrode plate 36$i$, and includes a gas flow passage 37$b$2. The gas flow passage 37$b$2 originates from the lower end of the gas flow passage 37$b$1, and extends horizontally toward the gap D. Gas passes through the gas flow passage 37$b$1 and the gas flow passage 37$b$2 in the order of the gas flow passage 37$b$1 and the gas flow passage 37$b$2. Each of the second gas flow passages 37$b$ communicates with a path 43 through which a gas is supplied to the gap D, and the gas supplied from the second gas flow passage 37$b$ to the path 43 flows into the gap D.

In the present embodiment, a process gas used for processing a substrate W is supplied to the first gas flow passages 37$a$ and the second gas flow passages 37$b$. However, gas that is supplied to the first gas flow passages 37$a$ and the second gas flow passages 37$b$ is not limited thereto, and other types of gas may be supplied to the first gas flow passages 37$a$ and the second gas flow passages 37$b$. For example, a purge gas, such as $N_2$ gas, may be supplied. That is, either a reactive gas or an inert gas may be supplied to the gap D. Types of gas flowing through the first gas flow passages 37$a$ may be the same as or different from that flowing through the second gas flow passages 37$b$.

An electrode plate in which the gas flow passages 37 are formed is not limited to the inner electrode plate 36$i$. For example, gas flow passages may be formed in at least one of the inner electrode plate 36$i$ and the outer electrode plate 36$o$. That is, gas may be supplied to the gap D from the outer electrode plate 36$o$ side, or gas may be supplied to the gap D from both the inner electrode plate 36$i$ side and the outer electrode plate 36$o$ side. By supplying gas to the gap D from at least one of the inner electrode plate 36$i$ side and the outer electrode plate 36$o$ side, gas in the gap D can be replaced with the supplied gas. In addition, by adjusting conductance (flow rate) of a gas flowing into the gap D, deposits R adhering to the gap D can be removed, and deposits R can be prevented from adhering to the gap D.

[Variations]

Figure 2C:
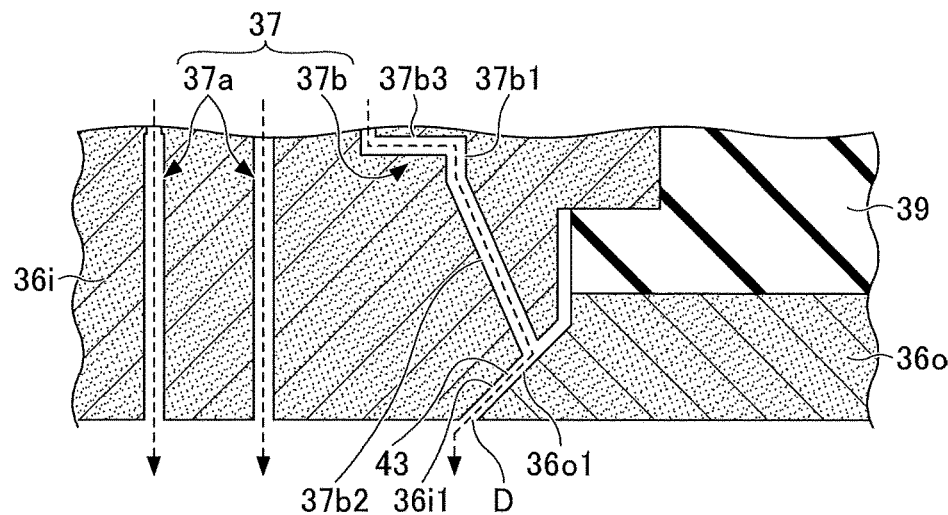
FIG. 2C illustrates a variation of a second gas flow passage.

A variation of the second gas flow passage 37$b$ will be described with reference to FIG. 2C. The second gas flow passage 37$b$ according to the variation includes a gas flow passage 37$b$1 directed toward the thickness direction of the inner electrode plate 36$i$, and a gas flow passage 37$b$2 that originates from the lower end of the gas flow passage 37$b$1 and that extends toward the gap D. The second gas flow passage 37$b$ further includes a gas flow passage 37$b$3 that originates from the upper end of the gas flow passage 37$b$1 and that extends toward the center of the inner electrode plate 36$i$ in a direction perpendicular to the thickness direction of the inner electrode plate 36$i$. Thus, gas flows through the gas flow passage 37$b$3, the gas flow passage 37$b$1, and the gas flow passage 37$b$2 in sequence. According to the above-described configuration, gas can be supplied from the inner electrode plate 36$i$ to the gap D directly. However, the configuration of the second gas flow passage 37$b$ is not limited thereto, and any configuration may be employed as long as a process gas can be directly supplied to the gap D.

For example, two or more gas flow passages 37$b$2 branching from a single gas flow passage 37$b$1 and extending toward the gap D may be formed. Also, the gas flow passage 37$b$1 may be a passage penetrating the inner electrode plate 36$i$ in its thickness direction, and the gas flow passage 37$b$2 may branch from the intermediate section of this gas flow passage 37$b$1. In addition, the flow path that supplies gas to the gap D may be a passage branching from at least one of the first gas flow passages 37$a$ penetrating the inner electrode plate 36$i$ in its thickness direction. That is, the flow passage for supplying gas to the gap D may be a passage branching not only from the second gas flow passage 37$b$, which is located furthest from the center of the inner electrode plate 36$i$ among gas flow passages formed in the inner electrode plate 36$i$, but also from the first gas flow passage 37$a$ located at the inner side of the second gas flow passage 37$b$. In a case in which gas flow passages are formed in the outer electrode plate 36$o$, a flow passage for supplying gas to the gap D may be the outermost gas flow passage among the gas flow passages formed in the outer electrode plate 36$o$, a gas flow passage located at the inner side of the outermost gas flow passage, or both.

Figure 3A:
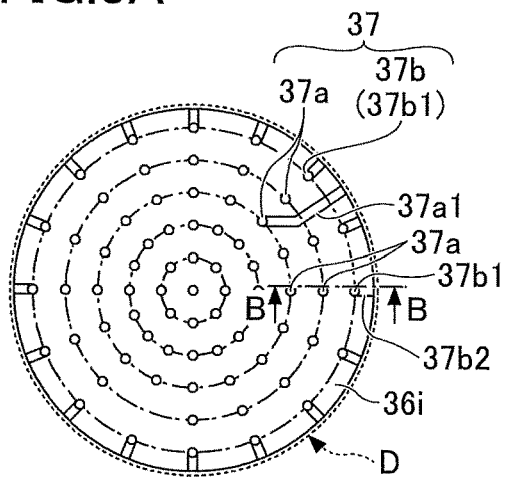
FIGS. 3A to 3E are diagrams each illustrating gas supply paths formed in an inner electrode plate.
Figure 3D:
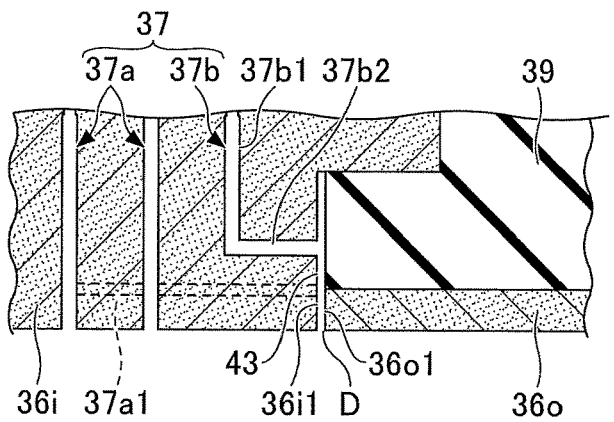
Figure 3B:
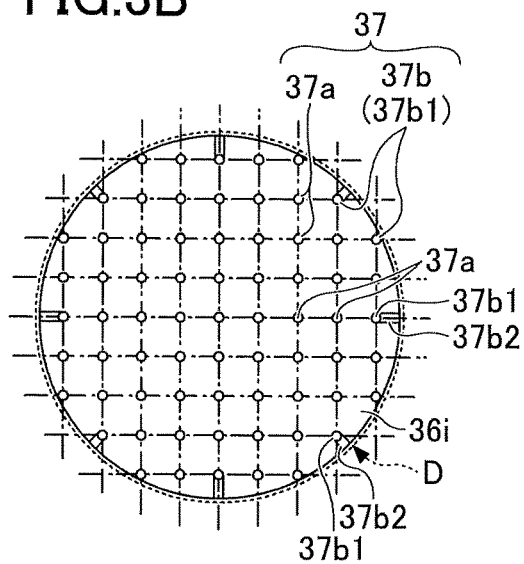
Figure 3C:
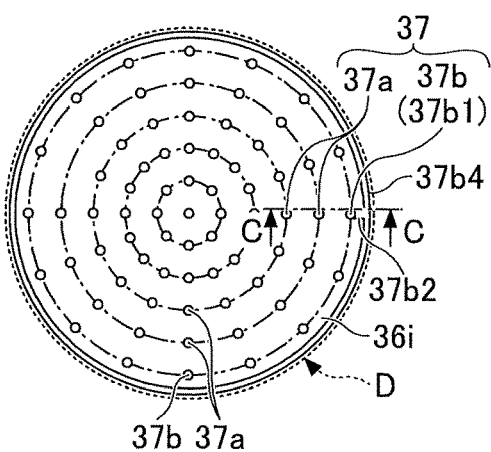

Referring to FIGS. 3A to 3E, supply paths of gas are illustrated, when viewing the inner electrode plate 36$i$ according to an embodiment from the above. FIGS. 3A to 3C illustrate examples of gas supply paths when the inner electrode plate 36$i$ according to an embodiment is viewed from the above.

In FIG. 3A, the first gas flow passages 37$a$ are circumferentially arranged on the inner electrode plate 36$i$, so as to form multiple concentric circles, and the second gas flow passages 37$b$ are circumferentially arranged outside the first gas flow passages 37$a$. Also, at least one gas flow passage 37$a$1 connecting one of the first gas flow passages 37$a$ with the gap D and gas flow passages 37$b$2 each connecting one of the second gas flow passages 37$b$ with the gap D are formed. In FIG. 3B, the first gas flow passages 37$a$ and the second gas flow passages 37$b$ are arranged in a lattice pattern on the inner electrode plate 36$i$, and the gas flow passages 37$b$2 are formed in the inner electrode plate 36$i$, each of which connects one of the second gas flow passages 37$b$ with the gap D. FIG. 3D is a cross-sectional view of the electrode plate 36 taken along the line B-B of FIG. 3A, and an example of a flow passage that causes a gas to flow into the gap D is illustrated as the gas flow passage 37$b$2 in FIG. 3D (a horizontal hole in FIG. 3D). The gas flow passage 37$b$2 that causes a gas to flow into the gap D is connected to the gas flow passage 37$b$1 of the second gas flow passage 37$b$ which is the outermost passage. However, the electrode plate 36 may be provided with a flow passage for causing a gas to flow toward the gap D from the first gas flow passage 37$a$ located at the inner side of the outermost second gas flow passage 37$b$. An example of the flow passage that causes a gas to flow from the first gas flow passage 37$a$ toward the gap D is illustrated as the gas flow passage 37$a$1 of FIGS. 3A and 3D. However, the gas flow passage 37$a$1 originating from the first gas flow passage 37$a$ is not required to be provided.

As illustrated in FIGS. 3A and 3B, the gas flow passages 37$b$2 that cause a gas to flow into the gap D are arranged at regular intervals. In FIG. 3A, each of the gas flow passages 37*b*2, which causes a gas to flow into the gap D, originates from a corresponding outermost gas flow passage 37*b*1, and the gas flow passages 37*b*2 are arranged at regular intervals. In FIG. 3B, among the outermost gas flow passages 37*b*1, eight gas flow passages 37*b*1 that are arranged at regular intervals communicate with the respective gas flow passages 37*b*2, which cause a gas to flow into the gap D.

Figure 3E:
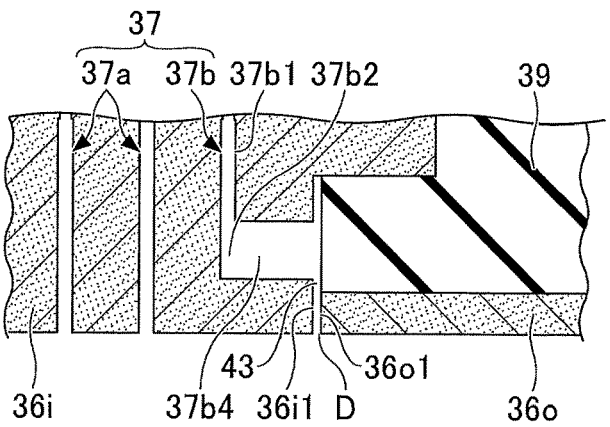

In FIG. 3C, the first gas flow passages 37*a* are circumferentially arranged on the inner electrode plate 36*i*, so as to form multiple concentric circles, and the second gas flow passages 37*b* are circumferentially arranged outside the first gas flow passages 37*a*. Further, a gas flow passage 37*b*2 and a groove 37*b*4 are formed, which cause a gas to flow into the gap D. The groove 37*b*4 is formed along the entire outer circumference (side surface) of the inner electrode plate 36*i*. The gas flow passage 37*b*2 originates from a gas flow passage 37*b*1 of one of the second gas flow passages 37*b*, and extends toward the groove 37*b*4. FIG. 3E is a cross-sectional view of the inner electrode plate 36*i* taken along the line C-C of FIG. 3C. A set of the gas flow passage 37*b*2 and the groove 37*b*4 illustrated in FIG. 3E is an example of flow passages that cause a gas to flow into the gap D. The groove 37*b*4 is an example of a recess formed on the entire circumference of the inner electrode plate 36*i*, which is opened toward the gap D. In other words, in this example, the groove 37*b*4 is circumferentially formed on the entire surface 36*i*1, which is the outer circumference of the inner electrode plate 36*i*, and a gas supplied from the single gas flow passage 37*b*2 is circumferentially spread to the groove 37*b*4, so that the gas is supplied to the gap D. However, the groove 37*b*4 may not be formed along the entire circumference of the inner electrode plate 36*i*. For example, multiple arc-shaped grooves 37*b*4 may be arranged along the circumference of the inner electrode plate 36*i* at regular intervals. In addition, the grooves 37*b*4 may be connected to respective gas flow passages 37*b*2, and gas may be spread from the gas flow passages 37*b*2 to the respective grooves 37*b*4, to supply the gas to the gap D.

In any of the configurations illustrated in FIGS. 3A to 3E, by causing a gas to flow into the gap D during processing of the substrate W, it is possible to prevent deposits R from adhering to the gap D and to remove the deposits R adhering to the gap D, Accordingly, the deposit R adhering to the gap D can be removed without requiring any special step such as a cleaning step. As a result, throughput can be improved compared to a case in which a special step such as a cleaning step is performed.

<Plasma Processing Method>

Next, an example of a plasma processing method according to an embodiment will be described with reference to FIG. 4. FIG. 4 is a flowchart illustrating an example of the plasma processing method according to the embodiment. The plasma processing method of FIG. 4 is controlled by the controller 100.

In the plasma processing method of FIG. 4, first, the controller 100 prepares a substrate W by loading the substrate W into the processing vessel 10 and placing the substrate W onto the stage 16 (step S1). Next, the controller 100 supplies gas from the first gas flow passages 37*a* and the second gas flow passages 37*b* (step S3). Next, the controller 100 applies radio frequency power (step S5). In step S5, the controller 100 also calculates a cumulative value of application time of the radio frequency power. Next, the controller 100 applies DC voltage from the first variable power supply 71 to the inner electrode plate 36*i*, and applies DC voltage from the second variable power supply 72 to the outer electrode plate 36*o* (step S7).

Next, the controller 100 etches the substrate W by a plasma formed from the gas by the radio frequency power (step S9). Next, in step S11, the controller 100 unloads the processed substrate W.

Next, in step S13, the controller 100 determines whether a next unprocessed substrate is present. When it is determined that the next substrate is present, the present process reverts to step S1, and the controller 100 prepares the next unprocessed substrate W, applies a plasma process to the next substrate W, and unloads the substrate W (steps S1 to S11). If it is determined in step S13 that no next substrate is present, the controller 100 terminates the present process. At the end of the present process, the application of the radio frequency power and the supply of the gas are stopped.

As described above, according to the plasma processing apparatus 1 and the plasma processing method according to the present embodiment, it is possible to prevent reaction products from adhering to the gap between the members provided in the plasma processing apparatus 1.

The plasma processing apparatus according to the embodiments disclosed herein should be considered exemplary in all respects and not restrictive. The above-described embodiments may be modified and enhanced in various forms without departing from the appended claims and spirit thereof. Matters described in the above-described embodiments may take other configurations to an extent not inconsistent, and may be combined to an extent not inconsistent.

For example, although the above-described embodiment and its variations illustrate the example of preventing deposits from adhering to the gap D between the inner electrode plate 36*i* and the outer electrode plate 36*o*, a gap to which the present invention can be applied is not limited thereto. The present invention can be applied to various gaps between members in the processing vessel of the plasma processing apparatus 1, such as the gap between the inner electrode plate 36*i* and the shielding member 39, the gap between the outer electrode plate 36*o* and the shielding member 39, and the gap between the outer electrode plate 36*o* and the shielding member 42.

The plasma processing apparatus of the present disclosure is applicable to any of the following types of apparatuses: an atomic layer deposition (ALD) type processing apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

What is claimed is:

1. A plasma processing apparatus comprising:
   a processing vessel; and
   an upper electrode disposed at an upper side of the processing vessel and that comprises:
      a electrode having a disk-shape and provided in the processing vessel; and
      another electrode having a ring-shape, provided radially outward of the electrode, and facing the electrode through a gap,
      wherein at least one of the electrode or the another electrode comprises a gas flow passage connected to the gap and that causes a gas to flow into the gap, and
      wherein a size of the gap is between 0.5 mm and 1 mm.

2. The plasma processing apparatus according to claim 1, wherein the gas flow passage includes a plurality of passages each arranged at regular intervals.

3. The plasma processing apparatus according to claim 1, wherein the gas flow passage is connected to an outermost gas supply path of a plurality of gas supply paths.

4. The plasma processing apparatus according to claim 1, wherein
the gas flow passage includes a recess that is formed on a circumference of the at least one of the electrode or the another electrode, and
the recess is opened toward the gap.

5. The plasma processing apparatus according to claim 3, wherein the plurality of gas supply paths include paths penetrating the at least one of the electrode or the another electrode, and
the gas flow passage branches from a path of the paths penetrating the at least one of the electrode or the another electrode.

6. The plasma processing apparatus according to claim 1, wherein
the at least one of the electrode or the another electrode is configured such that direct-current voltage can be applied.

7. The plasma processing apparatus according to claim 2, wherein the gas flow passage is connected to an outermost gas supply path of a plurality of gas supply paths.

8. The plasma processing apparatus according to claim 7, wherein
the gas flow passage includes a recess that is formed on a circumference of the at least one of the electrode or the another electrode, and
the recess is opened toward the gap.

9. The plasma processing apparatus according to claim 8, wherein the plurality of gas supply paths include paths penetrating the at least one of the electrode or the another electrode, and
the gas flow passage branches from a path of the paths penetrating the at least one of the electrode or the another electrode.

10. The plasma processing apparatus according to claim 9, wherein
the at least one of the electrode or the another electrode is configured such that direct-current voltage can be applied.

11. The plasma processing apparatus according to claim 1, wherein the gas flow passage is formed in the electrode.

12. The plasma processing apparatus according to claim 1, further comprising:
an insulating electrode disposed between the electrode and the another electrode.

13. The plasma processing apparatus according to claim 1, further comprising:
an insulating member disposed on top of the another electrode.

14. The plasma processing apparatus according to claim 13, wherein the electrode and the insulating member have a gap.

15. A plasma processing apparatus comprising:
a processing vessel; and
an upper electrode disposed at an upper side of the processing vessel and that comprises:
an inner electrode having a disk-shape and provided in the processing vessel; and
an outer electrode having a ring-shape, provided radially outward of the inner electrode, and facing the inner electrode through a gap,
wherein at least one of the inner electrode or the outer electrode comprises a gas flow passage connected to the gap and that causes a gas to flow into the gap, and
wherein a size of the gap is between 0.5 mm and 1 mm.

* * * * *